(12) United States Patent
Cho et al.

(10) Patent No.: US 7,563,627 B2
(45) Date of Patent: Jul. 21, 2009

(54) METHOD OF MANUFACTURING THIN FILM TRANSISTOR ARRAY SUBSTRATE

(75) Inventors: Yong Jin Cho, Seoul (KR); Jung Il Lee, Seoul (KR)

(73) Assignee: LG Display Co., Ltd., Seoul (KR)

(*) Notice: Subject to any disclaimer, the term of this patent is extended or adjusted under 35 U.S.C. 154(b) by 44 days.

(21) Appl. No.: 10/975,537

(22) Filed: Oct. 29, 2004

(65) Prior Publication Data
US 2005/0095759 A1    May 5, 2005

(30) Foreign Application Priority Data
Oct. 30, 2003    (KR)    .................... 2003-76497

(51) Int. Cl.
*H01L 21/00* (2006.01)
(52) U.S. Cl. .................... 438/30; 438/158; 349/42
(58) Field of Classification Search ............ 438/149, 438/151, 161, 164, 29, 30, 158; 349/42, 349/43, 46; 257/E21.414, E27.111, E27.113
See application file for complete search history.

(56) References Cited

U.S. PATENT DOCUMENTS

| | | | |
|---|---|---|---|
| 6,038,003 A * | 3/2000 | Kim | 349/43 |
| 6,166,785 A * | 12/2000 | Ha | 349/42 |
| 6,204,081 B1 * | 3/2001 | Kim et al. | 438/30 |
| 6,275,275 B1 * | 8/2001 | Ha | 349/42 |
| 6,582,982 B2 * | 6/2003 | Jeong et al. | 438/30 |
| 6,620,655 B2 * | 9/2003 | Ha et al. | 438/149 |
| 6,746,887 B1 * | 6/2004 | Moon et al. | 438/30 |
| 7,462,516 B2 * | 12/2008 | Ahn | 438/149 |
| 2002/0110960 A1 * | 8/2002 | Kim et al. | 438/151 |
| 2003/0017636 A1 * | 1/2003 | Lay et al. | 438/30 |
| 2003/0086046 A1 * | 5/2003 | You | 349/149 |
| 2004/0075782 A1 * | 4/2004 | Ha et al. | 349/43 |
| 2004/0126917 A1 * | 7/2004 | Yoo et al. | 438/30 |

FOREIGN PATENT DOCUMENTS

| | | |
|---|---|---|
| KR | 1020020078499 | 10/2002 |
| KR | 1020030057059 | 7/2003 |

* cited by examiner

*Primary Examiner*—M. Wilczewski
*Assistant Examiner*—Seth Barnes
(74) *Attorney, Agent, or Firm*—McKenna Long & Aldridge LLP

(57) ABSTRACT

A method of manufacturing a thin film transistor array substrate to prevent damage to a pad is disclosed. The method includes forming gate lines and data lines that cross each other on a lower substrate, a gate insulating film located between the gate and data lines, a thin film transistor formed at every crossing, a lower gate pad electrode connected to the gate, and a lower data pad electrode; forming a passivation film on the substrate provided with the gate insulating film; forming a photo-resist pattern on the substrate provided with the passivation film; forming a first hole passing through a portion of the passivation film and a portion of the gate insulating film; removing the photo-resist pattern; forming a second hole exposing the lower gate pad electrode; and forming a transparent electrode pattern including an upper gate pad electrode connected to the exposed lower gate pad electrode.

18 Claims, 19 Drawing Sheets

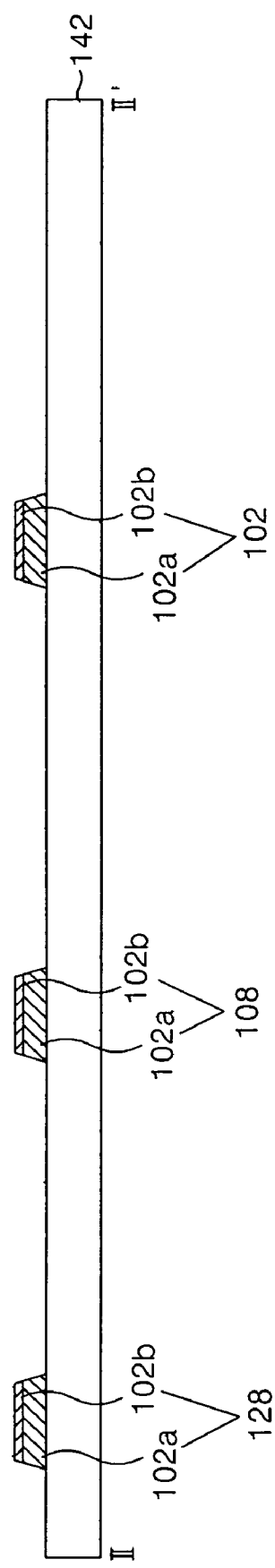

METHOD OF MANUFACTURING THIN FILM TRANSISTOR ARRAY SUBSTRATE

This application claims the benefit of Korean Patent Application No. P2003-76497 filed on Oct. 30, 2003, which is hereby incorporated by reference for all purposes as if fully set forth herein.

BACKGROUND OF THE INVENTION

1. Field of the Invention

The present invention relates to a method of manufacturing a thin film transistor array substrate. More particularly, the present invention relates to a method of manufacturing a thin film transistor array substrate capable of preventing damage to a gate pad.

2. Description of the Related Art

Generally, a liquid crystal display device represents an image by adjusting a transmittance of a liquid crystal material using an electric field. For this purpose, the liquid crystal display device comprises a liquid crystal display panel in which liquid crystal cells are arranged in a matrix pattern, and a driving circuit for driving the liquid crystal display panel.

The liquid crystal display panel includes a thin film transistor array substrate and a color filter array substrate that face each other, a spacer for maintaining a cell gap between the two substrates and a liquid crystal material in the cell gap.

The thin film transistor array substrate includes gate lines and data lines, a thin film transistor formed as a switching device at each crossing of the gate lines and the data lines, a pixel electrode connected to the thin film transistor, and an alignment film applied on them. The gate lines and the data lines receive signals from the driving circuits through pads. The thin film transistor, in response to a scan signal supplied to a gate line, supplies a pixel voltage signal to the pixel electrode from the data line.

The color filter array substrate includes a color filter formed by a unit of the liquid crystal cell, a black matrix for reflecting external light and separating between the color filters, a common electrode commonly supplying a reference voltage to the liquid crystal cells, and the alignment film.

The liquid crystal display panel is fabricated by combining the thin film transistor array substrate and the color filter array substrate each of which are separately manufactured, injecting the liquid crystal material between the substrates and sealing the substrates with the liquid crystal material therebetween.

In such a liquid crystal display device, because the thin film transistor array substrate involves a semiconductor process and requires a plurality of mask processes, the manufacturing process is complicated and contributes to high costs in the manufacture of the liquid crystal display panel. In order to solve this, development has been done with respect to the thin film transistor array substrate to reduce the number of mask processes. This is because one mask process includes many sub-processes such as thin film deposition, cleaning, photolithography, etching, photo-resist stripping, inspection processes and the like. A four-round mask process has been developed in which one mask process is reduced from an existing five-round mask process that is employed as a standard mask process.

FIG. 1 is a plan view illustrating the thin film transistor array substrate using a four-round mask process, and FIG. 2 is a sectional view illustrating the thin film transistor array substrate taken along line I-I' in FIG. 1.

The thin film transistor array substrate, shown in FIG. 1 and FIG. 2, includes gate lines 2 and data lines 4 crossing with each other and having a gate insulating film 44 therebetween on a lower substrate 42, a thin film transistor 6 formed at every crossing, and a pixel electrode 18 formed in the cell region resulting from the crossing pattern of the gate lines 2 and data lines 4. Further, the thin film transistor array substrate includes a storage capacitor 20 formed at an overlapped part of the pixel electrode 18 and a pre-stage gate line 2, a gate pad part 26 connected to the gate line 2 and a data pad part 34 connected to the data line 4.

The thin film transistor 6 includes a gate electrode 8 connected to the gate line 2, a source electrode 10 connected to the data line 4, a drain electrode 12 connected to a pixel electrode 18, and an active layer 14 of semiconductor pattern 47 defining a channel between the source electrode 10 and the drain electrode 12 and overlapping the gate electrode 8. The active layer 14 overlaps with a lower data pad electrode 36, a storage electrode 22, the data line 4, the source electrode 10 and the drain electrode 12, and further includes a channel portion defined between the source electrode 10 and the drain electrode 12. An ohmic contact layer 48 of the semiconductor pattern 47 for making an ohmic contact with the lower data pad electrode 36, the storage electrode 22, the data line 4, the source electrode 10 and the drain electrode 12 are further formed on the active layer 14. The thin film transistor 6 responds to a gate signal supplied to the gate line 2 and makes a pixel voltage signal supplied to the data line 4 charged to the pixel electrode 18.

The gate line 2 and the gate electrode 8 have a structure in which an aluminum system metal layer 2a of aluminum system metal, e.g., an aluminum neodium (AlNd) and a molybdenum (Mo) metal layer 2b of molybdenum (Mo) are stacked.

The pixel electrode 18 is connected to the drain electrode 12 of the thin film transistor 6 via a first contact hole 16 passing through a passivation film 50. The pixel electrode 18 generates a potential difference along with the common electrode formed on the upper substrate (not shown) by a pixel voltage charged. By this potential difference, the liquid crystal material located between the thin film transistor substrate and the upper substrate rotates due to a dielectric anisotropy, and makes incident light through the pixel electrode 18 from the light source (not shown) transmit to the upper substrate.

The storage capacitor 20 includes a pre-stage gate line 2, a storage electrode 22 overlapping the pre-stage gate line 2 having the gate insulating film 44, the active layer 14 and the ohmic contact layer 48 therebetween, and the pixel electrode 18 connected through a second contact hole 24 formed at the passivation film 50 and overlapped with the storage electrode 22 having the passivation film 50 therebetween. The storage capacitor 20 makes the pixel voltage charged to the pixel electrode 18 stably maintain until a next pixel voltage is charged.

The gate line 2 is connected to a gate driver (not shown) through the gate pad part 26. The gate pad part 26 includes a lower gate pad electrode 28 extending from the gate line 2 and an upper gate pad electrode 32 connected to the lower gate pad electrode 28 via a third contact hole 30 passing through both of the gate insulating film 44 and the passivation film 50. The lower gate pad electrode 28 has a structure in which an aluminum system metal layer 2a of the aluminum system metal and a molybdenum (Mo) metal layer 2b of the molybdenum (Mo) are stacked, which is similar to the structure of the gate line 2.

The data line 4 is connected to the data driver (not shown) through the data pad part 34. The data pad part 34 includes the lower data pad electrode 36 extending from the data line 4 and an upper data pad electrode 40 connected to the lower data pad electrode 36 via a fourth contact hole 38 passing through the passivation film 50.

A method of manufacturing the thin film transistor substrate having the above-mentioned configuration of FIGS. 1 and 2 will be described by way of a four-round mask process illustrated in FIGS. 3A to 3D.

In FIG. 3A, gate patterns are formed on the lower substrate 42.

On the lower substrate 42, an aluminum system metal, e.g., an aluminum neodium (AlNd), and a molybdenum (Mo) are sequentially stacked by a deposition method such as sputtering. Subsequently, the aluminum neodium (AlNd) and the molybdenum (Mo) are then patterned by photolithography using a first mask and an etching process to form the gate patterns including the gate line 2, the gate electrode 8 and the lower gate pad electrode 28, all of which have a double-layer structure of the aluminum metal layer 2a and the molybdenum (Mo) layer 2b.

In FIG. 3B, the gate insulating film 44, the active layer 14, the ohmic contact layer 48 and source/drain patterns are sequentially formed on the lower substrate 42 provided with the gate patterns.

The gate insulating film 44, an amorphous silicon layer, a n$^+$ amorphous silicon layer and a source/drain metal layer are sequentially formed on the lower substrate 42 having the gate patterns thereon by a deposition technique such as plasma enhanced chemical vapor deposition (PECVD) and sputtering.

A photo-resist pattern is formed on the source/drain metal layer by a photolithography process using a second mask. In this case, a diffractive exposure mask having a diffractive exposing part is used as a second mask wherein the diffractive exposing part corresponds to a channel portion of the thin film transistor. As a result, a photo-resist pattern of the channel portion has a lower height than a photo-resist pattern of the source/drain pattern part.

Subsequently, the source/drain metal layer is patterned by a wet etching process using the photo-resist pattern, to thereby form source/drain patterns including the data line 4, the source electrode 10, the drain electrode 12 being integral to the source electrode 10 and the storage electrode 22.

Next, the amorphous silicon layer and the n$^+$ amorphous silicon layer are patterned at the same time by a dry etching process using the same photo-resist pattern to thereby form the semiconductor pattern 47 including the ohmic contact layer 48 and the active layer 14.

The photo-resist pattern having a relatively low height in the channel portion is removed by an ashing process. And then, the source/drain pattern and the ohmic contact layer 48 of the channel portion are etched by a dry etching process. Accordingly, the active layer 14 of the channel portion is exposed to separate the source electrode 10 from the drain electrode 12.

Thereafter, a remainder of the photo-resist pattern left on the source/drain pattern is removed using a stripping process.

The gate insulating film 44 is made of an inorganic insulating material such as silicon oxide (SiO$_x$) or silicon nitride (SiN$_x$). A metal of the source/drain pattern includes a molybdenum (Mo), a titanium (Ti), tantalum (Ta) or a molybdenum alloy.

In FIG. 3C, the passivation film 50 including first to fourth contact holes 16, 24, 30 and 38 is formed on the gate insulating film 44 having the source/drain patterns.

The passivation film 50 is entirely formed on the gate insulating film 44 having the source/drain patterns by a deposition technique such as a plasma enhanced chemical vapor deposition (PECVD). The passivation film 50 is patterned by photolithography using a third mask and an etching process to thereby form the first to fourth contact holes 16, 24, 30 and 38. The first contact hole 16 is formed in such a manner to pass through the passivation film 50 and expose the drain electrode 12, whereas the second contact hole 24 is formed in such a manner to pass through the passivation film 50 and expose the storage electrode 22. The third contact hole 30 is formed in such a manner to pass through the passivation film 50 and the gate insulating film 44 and expose the lower gate pad electrode 28, and the fourth contact hole 38 is formed in such a manner to pass through the passivation film 50 and expose the lower data pad electrode 36.

The passivation film 50 is made of an inorganic insulating material such as a material of the gate insulating film 44 or an organic insulating material having a small dielectric constant such as an acrylic organic compound, BCB (benzocyclobutane) or PFCB (perfluorocyclobutane).

In FIG. 3D, transparent electrode patterns are formed on the passivation film 50.

A transparent electrode material is entirely deposited on the passivation film 50 by a deposition technique such as a sputtering and the like. Then, the transparent electrode material is patterned by photolithography using a fourth mask and an etching process, to provide the transparent electrode patterns including the pixel electrode 18, the upper gate pad electrode 32 and the upper data pad electrode 40. The pixel electrode 18 is electrically connected, via the first contact hole 16, to the drain electrode 12 while being electrically connected, via the second contact hole 24, to the storage electrode 22 overlapping a pre-stage gate line 2. The upper gate pad electrode 32 is electrically connected, via the third contact hole 30, to the lower gate pad electrode 28. The upper data pad electrode 40 is electrically connected, via the fourth contact hole 38, to the lower data pad electrode 36. The transparent electrode pattern material may be made of an indium-tin-oxide (ITO), a tin-oxide (TO) or an indium-zinc-oxide (IZO).

Meanwhile, in the method of manufacturing the thin film transistor array substrate of the related art, upon forming the third contact hole 30 exposing the lower gate pad electrode 28, the aluminum system metal layer 2a is melted or rusted through the use of a developer or a stripper. As a result, damage occurs in the gate pad, which results in an unreliable electrical connection of the aluminum system metal layer 2a with the upper gate pad electrode 32.

More specifically describing with reference to FIGS. 4 and 5, the gate insulating film 44 and the passivation film 50 are stacked. Thereafter, a photo-resist pattern 55 is formed by a photolithography process and an etching process. Subsequently, the gate insulating film 44 and the passivation film 50 are patterned by using the photo-resist pattern 55 as a mask. At this time, when the gate insulating film 44 and the passivation film 50 are patterned, the molybdenum (Mo) layer 2b of the lower gate pad electrode 28 is also etched. As a result, the aluminum system metal layer 2a is exposed as shown in FIG. 4. After that, a stripping process is performed or a stripper is used to remove a poor photo-resist pattern and then to refresh the photo-resist pattern. Frequently the interface of the aluminum system metal layer 2a is corroded due to the stripping process or the stripper. Also, recently a developer including a lead ion (Pb+) is used in a stripping process, which causes damage to the aluminum system metal layer 2a. In other words, since an ionization tendency of aluminum Al is higher than that of lead Pb, the aluminum is easily ionized in an aqueous solution containing the lead and the aluminum. As a result, as shown in FIG. 5, the surface of the aluminum system metal layer 2a is damaged, or the aluminum system metal layer 2a is melted, which leads to damage to the pad.

SUMMARY OF THE INVENTION

Accordingly, the present invention is directed to a method of manufacturing a thin film transistor array substrate that substantially obviates one or more of the problems due to limitations and disadvantages of the related art.

An advantage of the present invention is to provide a method of manufacturing a thin film transistor array substrate capable of preventing damage to a gate pad.

To achieve this and other advantages of the invention, a method of manufacturing a thin film transistor array substrate according to the present invention includes: forming gate lines and data lines that cross each other on a lower substrate with a gate insulating film located between the gate lines and data lines, a thin film transistor formed at every crossing, a lower gate pad electrode connected to the gate line, and a lower data pad electrode; forming a passivation film on the substrate provided with the gate insulating film; forming a photo-resist pattern on the substrate provided with the passivation film; forming a first hole passing through a portion of the passivation film and a portion of the gate insulating film using the photo-resist pattern; removing the photo-resist pattern; forming a second hole exposing the lower gate pad electrode; and forming a transparent electrode pattern including an upper gate pad electrode connected to the exposed lower gate pad electrode.

It is to be understood that both the foregoing general description and the following detailed description are exemplary and explanatory and are intended to provide further explanation of the invention.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIGS. 8A to 8D are sectional views sequentially illustrating a method of manufacturing the thin film transistor array substrate according to an embodiment of the present invention;

DETAILED DESCRIPTION OF THE ILLUSTRATED EMBODIMENTS

Reference will now be made in detail to embodiments of the present invention, examples of which are illustrated in the accompanying drawings.

Hereinafter, embodiments of the present invention will be described in detail with reference to FIGS. 6 to 10.

Figure 1:
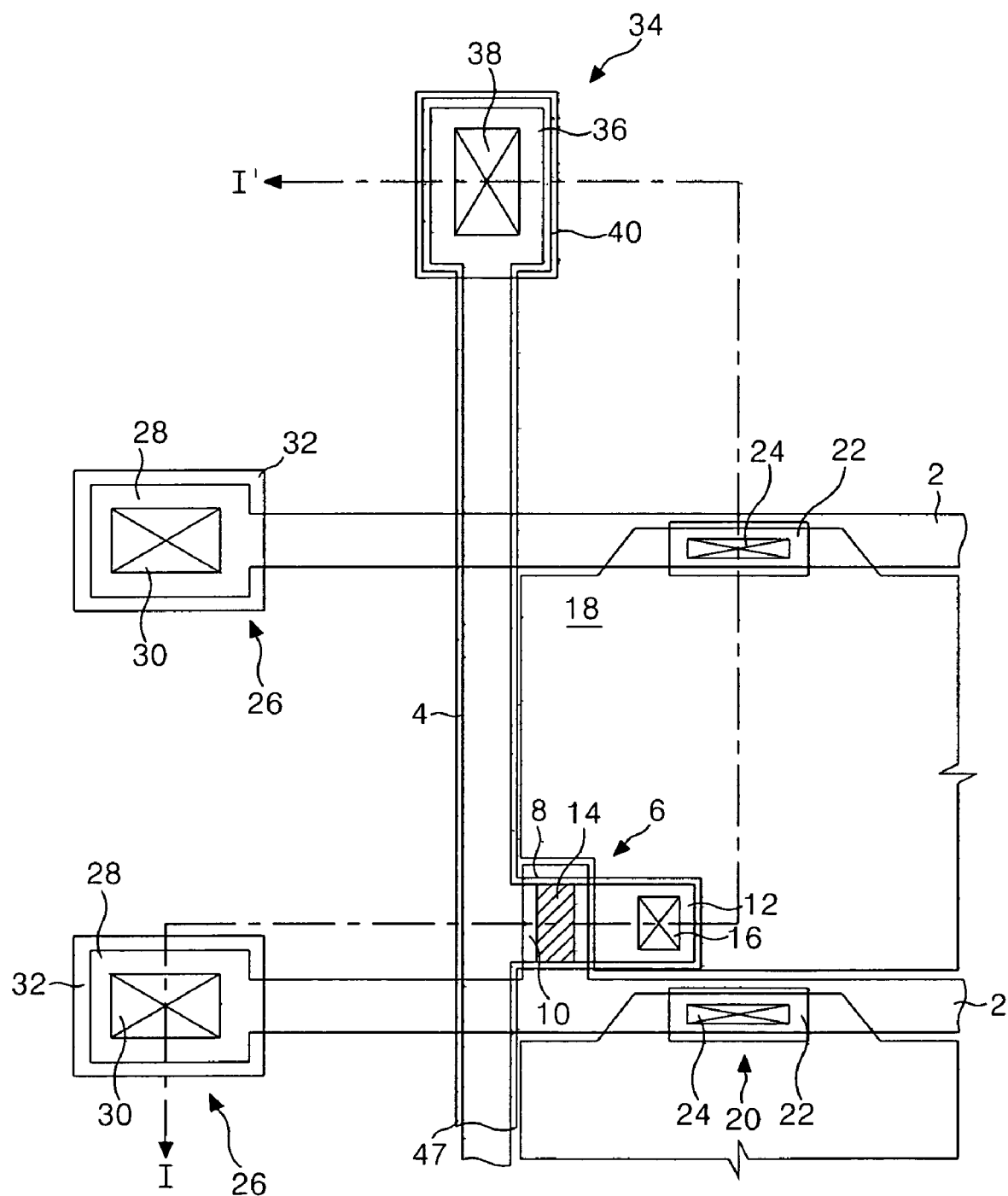
FIG. 1 is a plan view illustrating a portion of a related art thin film transistor array substrate.
Figure 2:
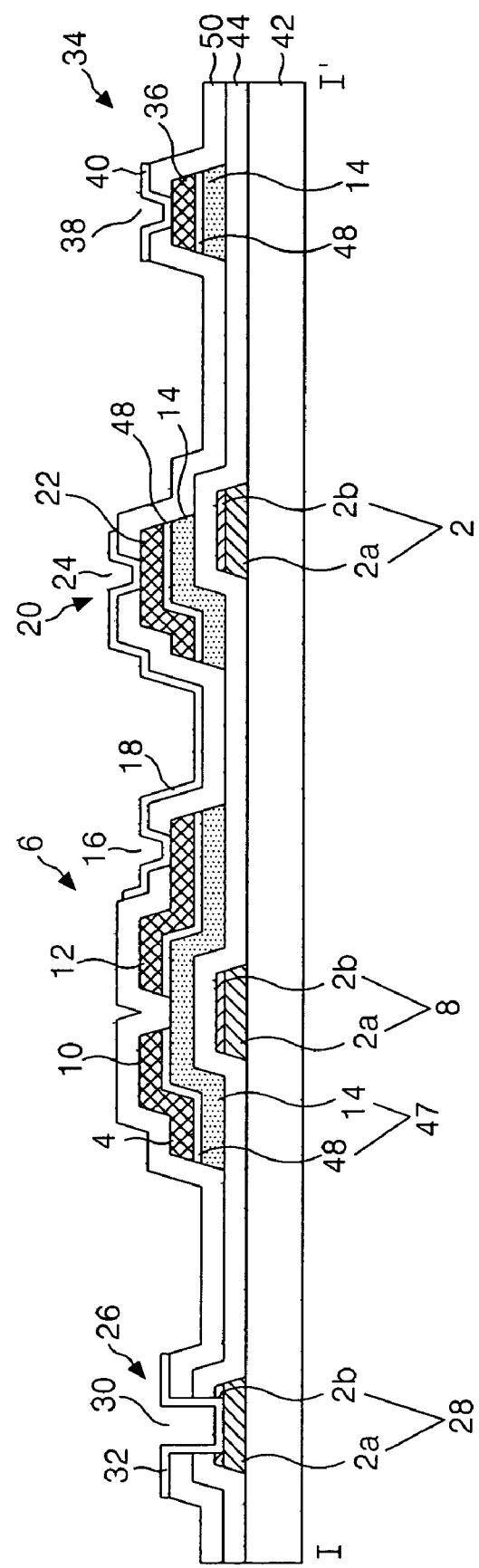
FIG. 2 is a sectional view of the thin film transistor array substrate taken along line I-I' in FIG. 1.
Figure 3A:
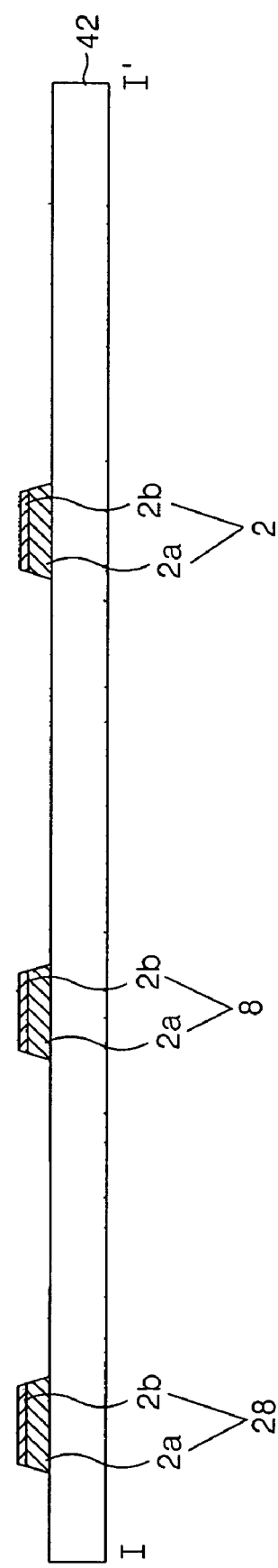
FIGS. 3A to 3D are sectional views sequentially illustrating a method of manufacturing the thin film transistor array substrate shown in FIG. 1 and FIG. 2.
Figure 3B:
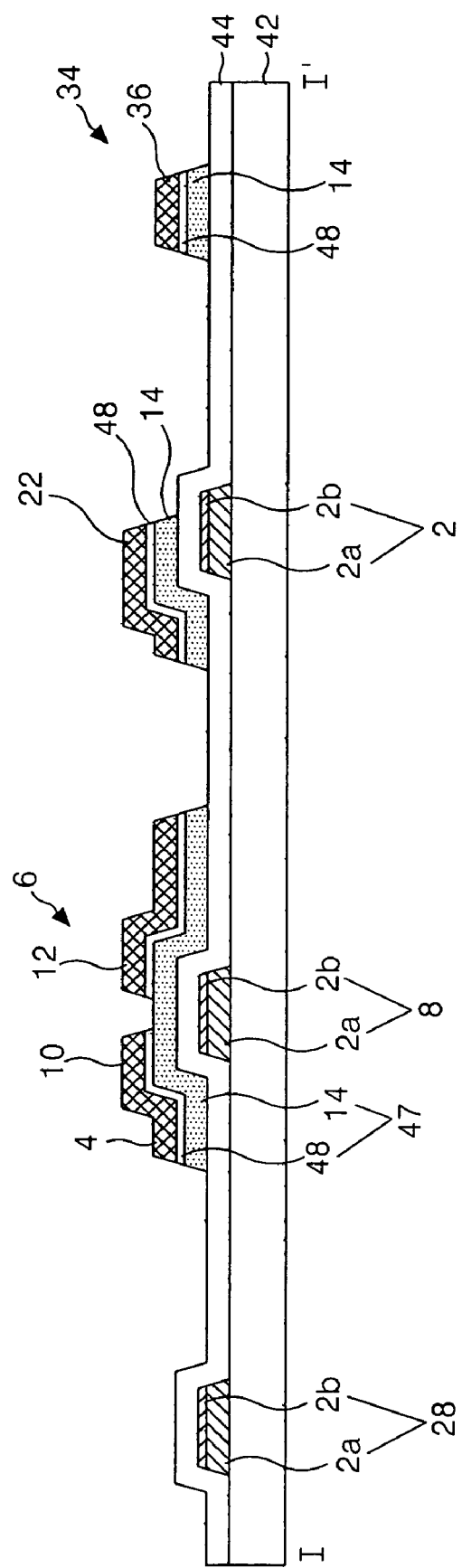
Figure 3C:
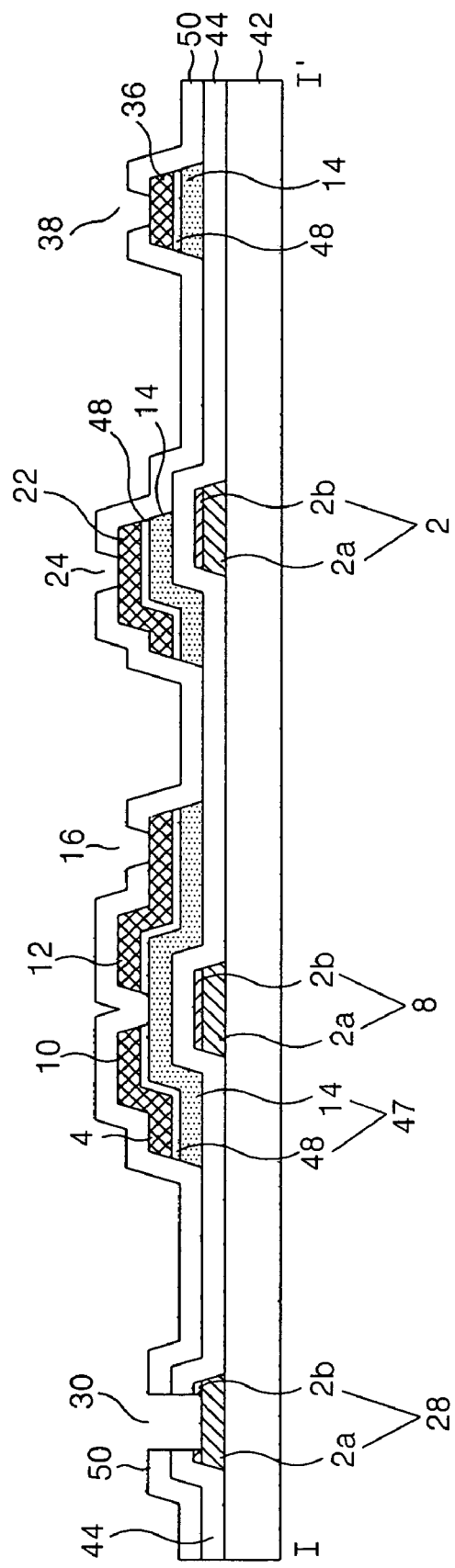
Figure 3D:
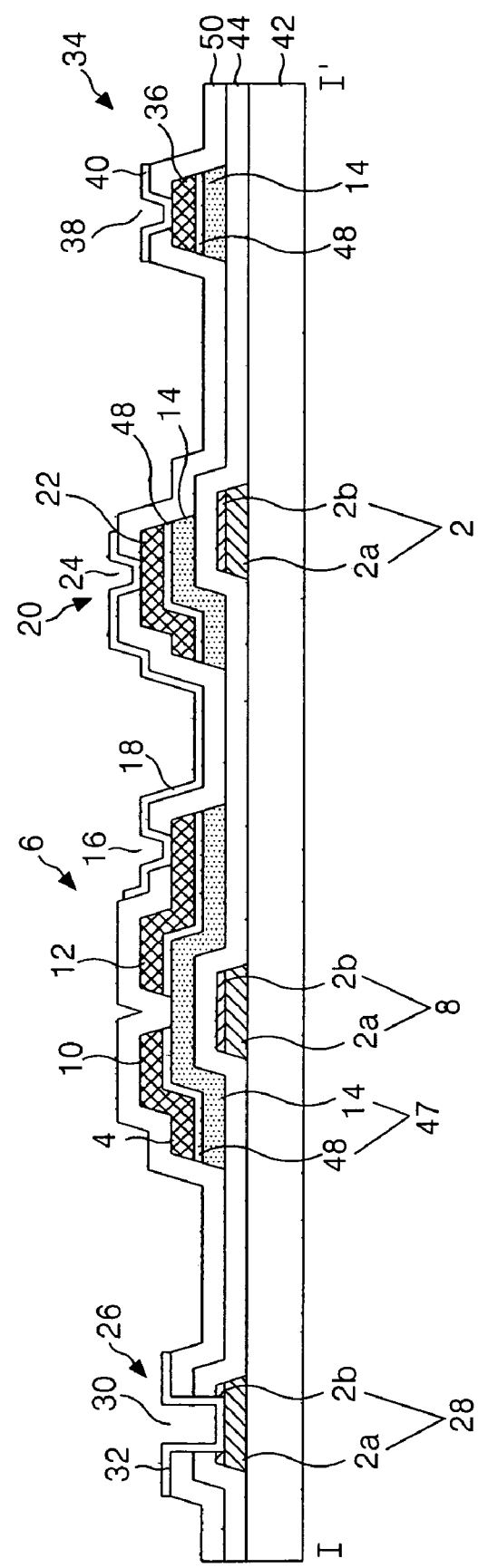
Figure 4:
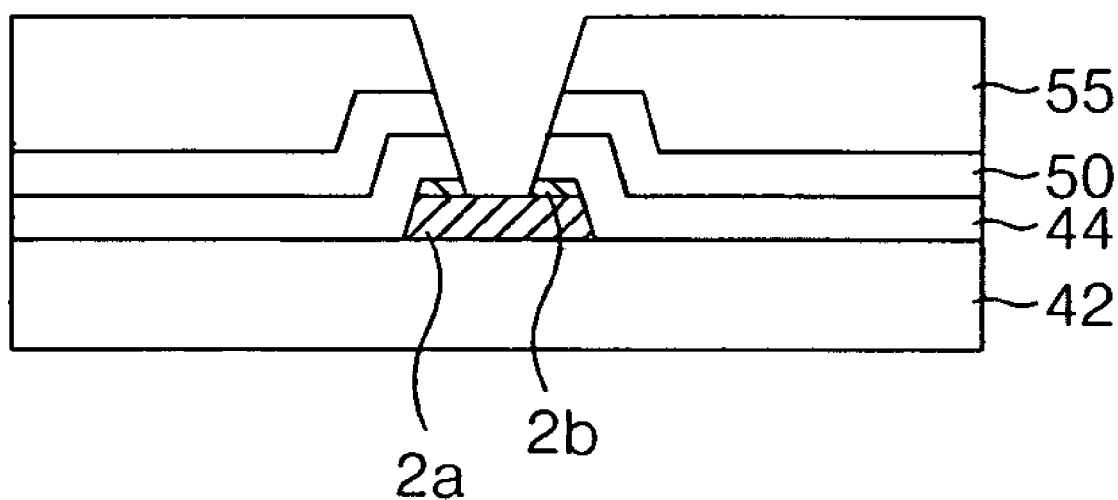
FIG. 4 is a sectional view illustrating an exposure of an aluminum system metal layer upon performing a pad open process in accordance with the related art.
Figure 5:
FIG. 5 is a photograph showing the damage of the aluminum system metal layer.
Figure 6:
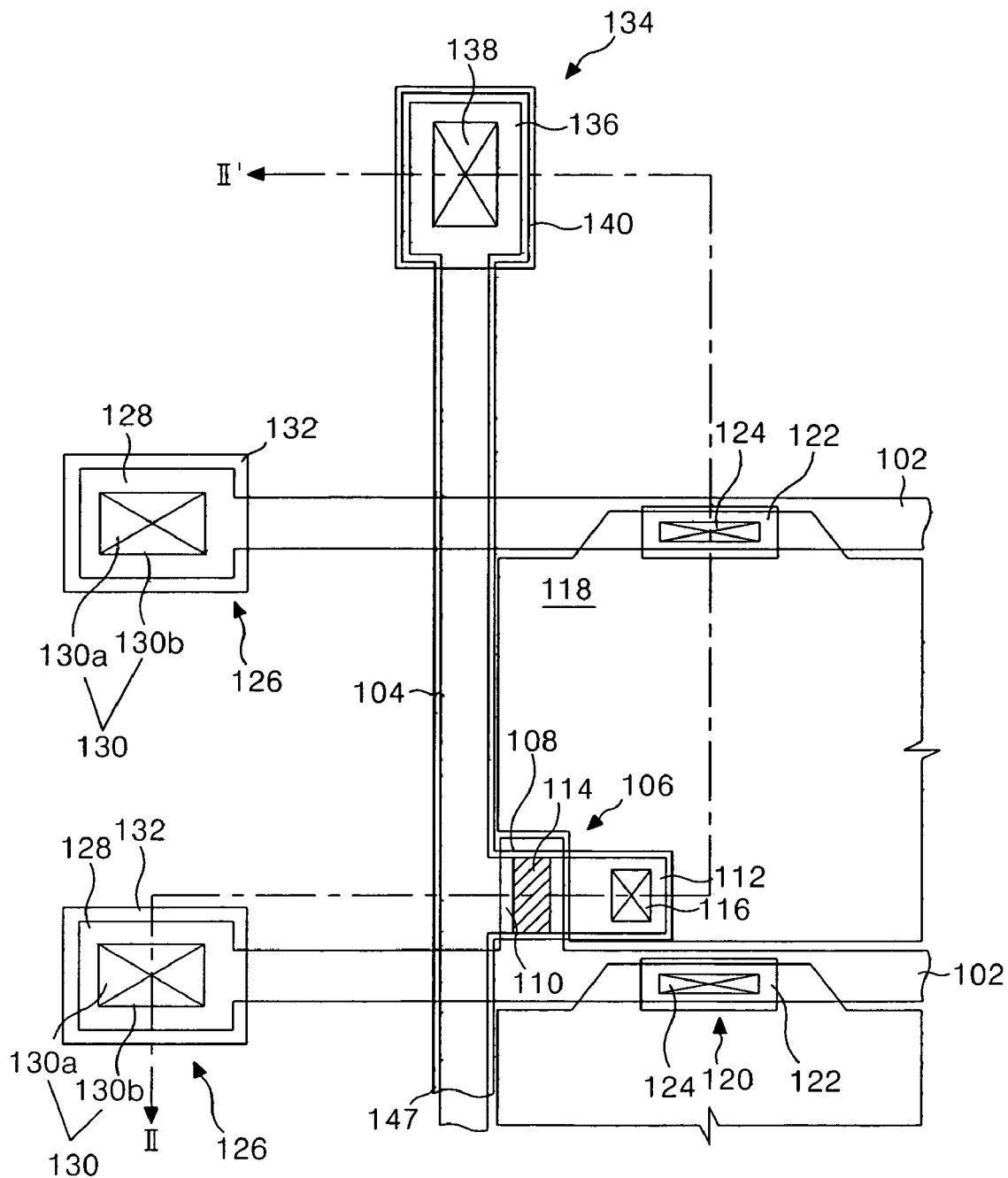
FIG. 6 is a plan view illustrating a thin film transistor array substrate according to an embodiment of the present invention.
Figure 7:
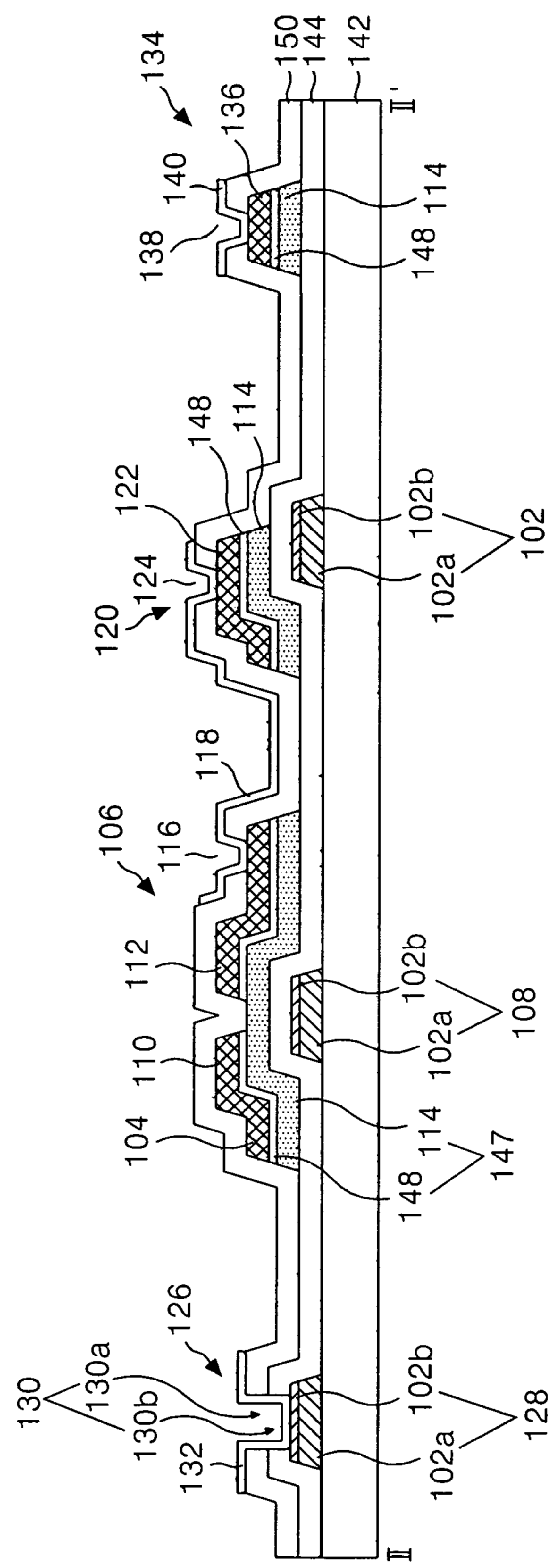
FIG. 7 is a sectional view of the thin film transistor array substrate taken along the line II-II' in FIG. 6.

FIG. 6 is a plan view illustrating a thin film transistor array substrate according to an embodiment of the present invention, and FIG. 7 is a sectional view of the thin film transistor array substrate taken along the line II-II' in FIG. 6.

The thin film transistor array substrate, shown in FIG. 6 and FIG. 7, includes gate lines 102 and data lines 104 crossing each other and having a gate insulating film 144 therebetween on a lower substrate 142, a thin film transistor 106 formed at each crossing of the gate line 102 and data line 104, and a pixel electrode 118 formed in the cell region resulting from the crossing of the gate and data lines. The thin film transistor array substrate further includes a storage capacitor 120 formed at an overlapped part of the pixel electrode 118 and a pre-stage gate line 102, a gate pad part 126 connected to the gate line 102 and a data pad part 134 connected to the data line 104.

The thin film transistor 106 includes a gate electrode 108 connected to the gate line 102, a source electrode 110 connected to the data line 104, a drain electrode 112 connected to a pixel electrode 118, and an active layer 114 of semiconductor pattern 147 which defines a channel between the source electrode 110 and the drain electrode 112 and overlaps the gate electrode 108. The active layer 114 is overlapped by a lower data pad electrode 136, a storage electrode 122, the data line 104, the source electrode 110 and the drain electrode 112, and defines a channel portion between the source electrode 110 and the drain electrode 112. An ohmic contact layer 148 of the semiconductor pattern 147 for making an ohmic contact with the lower data pad electrode 136, the storage electrode 122, the data line 104, the source electrode 110 and the drain electrode 112 is further formed on the active layer 114. The thin film transistor 106, in response to a gate signal supplied to the gate line 102, allows a pixel voltage signal supplied to the data line 104 to be charged to the pixel electrode 118.

The gate line 102 and the gate electrode 108 have a structure in which an aluminum system metal layer 102a such as an aluminum neodium (AlNd) and a molybdenum (Mo) layer 102b are stacked.

The pixel electrode 118 is connected to the drain electrode 112 of the thin film transistor 106 via a first contact hole 116 passing through a passivation film 150. The pixel electrode 118 generates a potential difference along with the common electrode formed on an upper substrate (not shown) by a charged pixel voltage. By this potential difference, liquid crystal materials located between the thin film transistor array substrate and the upper substrate rotate due to dielectric anisotropy, and light incident on the pixel electrode 118 from a light source (not shown) is transmitted to the upper substrate.

The storage capacitor 120 includes a pre-stage gate line 102, a storage electrode 122 overlapping the pre-stage gate line 102 having the gate insulating film 144, the active layer 114 and the ohmic contact layer 148 therebetween, and the pixel electrode 118 connected via a second contact hole 124 formed through the passivation film 150 and overlapped with the storage electrode 122 having the passivation film 150 therebetween. The storage capacitor 120 maintains the pixel voltage applied to the pixel electrode 118 until a next pixel voltage is applied.

The gate line 102 is connected to a gate driver (not shown) through the gate pad part 126. The gate pad part 126 includes a lower gate pad electrode 128 extending from the gate line 102 and an upper gate pad electrode 132 connected to the lower gate pad electrode 128 via a third contact hole 130 passing through both the gate insulating film 144 and the passivation film 150. The third contact hole 130 includes a first hole 130a passing through a portion of the passivation film 150 and a portion of the gate insulating film 144, and a second hole 130b overlapping the first hole 130a and exposing the lower gate pad electrode 128.

The lower gate pad electrode 128 has a structure in which the aluminum system metal layer 102a and the molybdenum (Mo) layer 102b are stacked, which is similar to the structure of the gate line 102.

The data line 104 is connected to the data driver (not shown) through the data pad part 134. The data pad part 134 includes the lower data pad electrode 136 extending from the data line 104 and an upper data pad electrode 140 connected to the lower data pad electrode 136 via a fourth contact hole 138 passing through the passivation film 150.

Hereinafter, a method of manufacturing the thin film transistor array substrate according to the present invention will be described with reference to FIGS. 8A to 9D.

In FIG. 8A, gate patterns are formed on the lower substrate 142.

On the lower substrate 142, an aluminum system metal, e.g., an aluminum neodium (AlNd), and a molybdenum (Mo) are sequentially stacked by a deposition method such as sputtering. Subsequently, the aluminum neodium (AlNd) and the molybdenum (Mo) are then patterned by photolithography using a first mask and an etching process to form the gate patterns including the gate line 102 having a double-layer structure of the aluminum metal layer 102a and the molybdenum (Mo) layer 102b, the gate electrode 108, and the lower gate pad electrode 128.

Figure 8B:
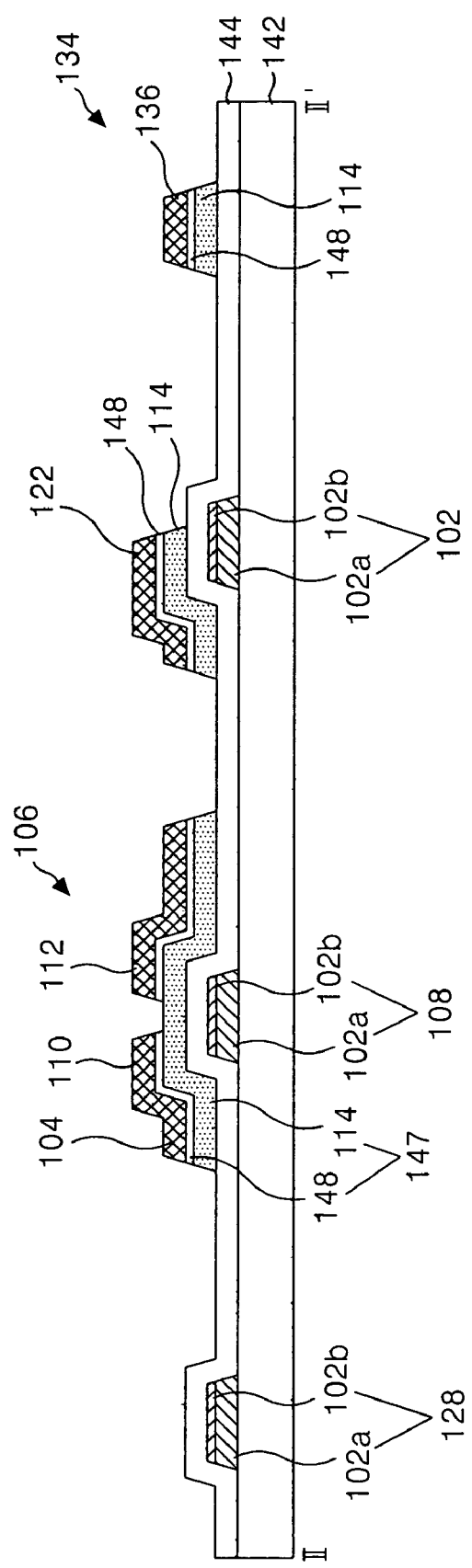

In FIG. 8B, the gate insulating film 144, the active layer 114, the ohmic contact layer 148 and source/drain patterns are sequentially formed on the lower substrate 142 provided with the gate patterns.

The gate insulating film 144, an amorphous silicon layer, a n+ amorphous silicon layer and a source/drain metal layer are sequentially formed on the lower substrate 142 having the gate patterns thereon by a deposition technique such as a plasma enhanced chemical vapor deposition (PECVD) and sputtering.

A photo-resist pattern is formed on the source/drain metal layer by a photolithography process using a second mask. In this case, a diffractive exposure mask having a diffractive exposing part is used as a second mask wherein the diffractive exposing part corresponds to a channel portion of the thin film transistor. As a result, a photo-resist pattern of the channel portion has a lower height than a photo-resist pattern of the source/drain pattern part.

Subsequently, the source/drain metal layer is then patterned by a wet etching process using the photo-resist pattern, to thereby form source/drain patterns including the data line 104, the source electrode 110, the drain electrode 112 being integral to the source electrode 110 and the storage electrode 122.

Next, the amorphous silicon layer and the n+ amorphous silicon layer are patterned at the same time by a dry etching process using the same photo-resist pattern to thereby form the semiconductor pattern 147 including the ohmic contact layer 148 and the active layer 114.

The photo-resist pattern having a relatively low height in the channel portion is removed by an ashing process, and thereafter, the source/drain pattern and the ohmic contact layer 148 of the channel portion are etched by a dry etching process. Accordingly, the active layer 114 of the channel portion is exposed to separate the source electrode 10 and the drain electrode 112 from each other.

Thereafter, a remainder of the photo-resist pattern left on the source/drain pattern is removed using a stripping process.

The gate insulating film 144 is made of an inorganic insulating material such as silicon oxide ($SiO_x$) or silicon nitride ($SiN_x$). A source/drain metal includes a molybdenum (Mo), a titanium (Ti), tantalum (Ta) or a molybdenum alloy.

Figure 8C:
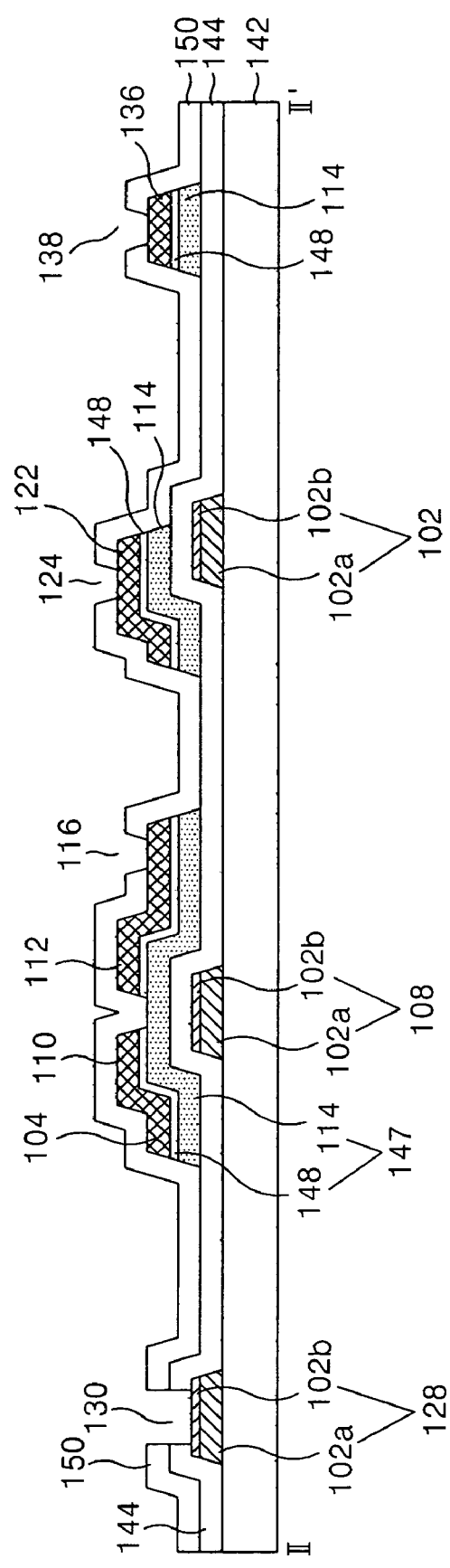

In FIG. 8C, the passivation film 150 including first to fourth contact holes 116, 124, 130 and 138 is formed on the gate insulating film 144 having the source/drain patterns thereon. The first contact hole 116 is formed to pass through the passivation film 150 and exposes the drain electrode 112, whereas the second contact hole 124 is formed to pass through the passivation film 150 and exposes the storage electrode 122. The third contact hole 130 is formed to pass through the passivation film 150 and the gate insulating film 144 and exposes the lower gate pad electrode 128, whereas the fourth contact hole 138 is formed to pass through the passivation film 150 and exposes the lower data pad electrode 136.

The passivation film 150 is made of an inorganic insulating material such as a material of the gate insulating film 144 or an organic insulating material having a small dielectric constant such as an acrylic organic compound, BCB (benzocyclobutane) or PFCB (perfluorocyclobutane).

FIGS. 9A to 9D are sectional views illustrating a three-round mask process.

Figure 9A:
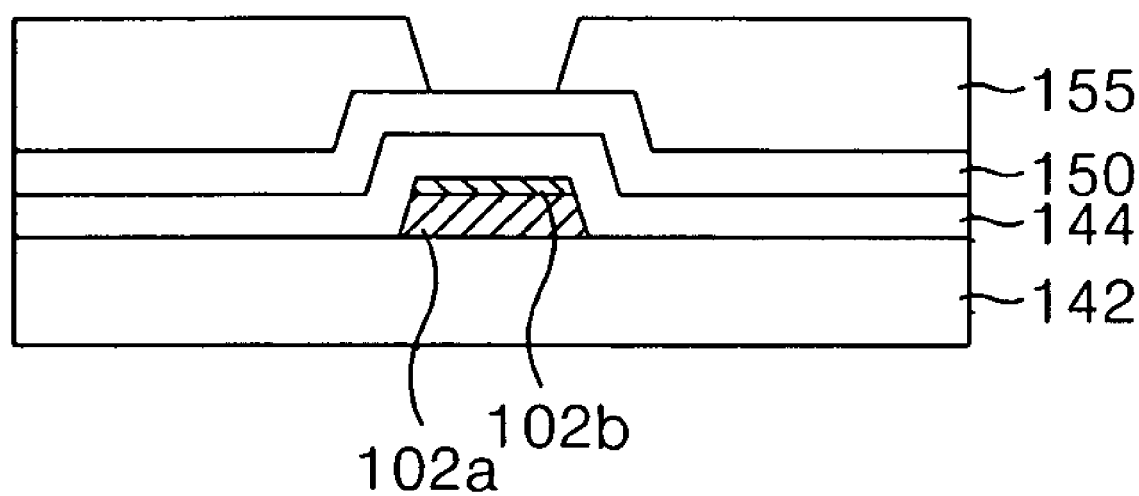
FIGS. 9A to 9D are sectional views illustrating the pad open process according to the present invention.
Figure 9B:
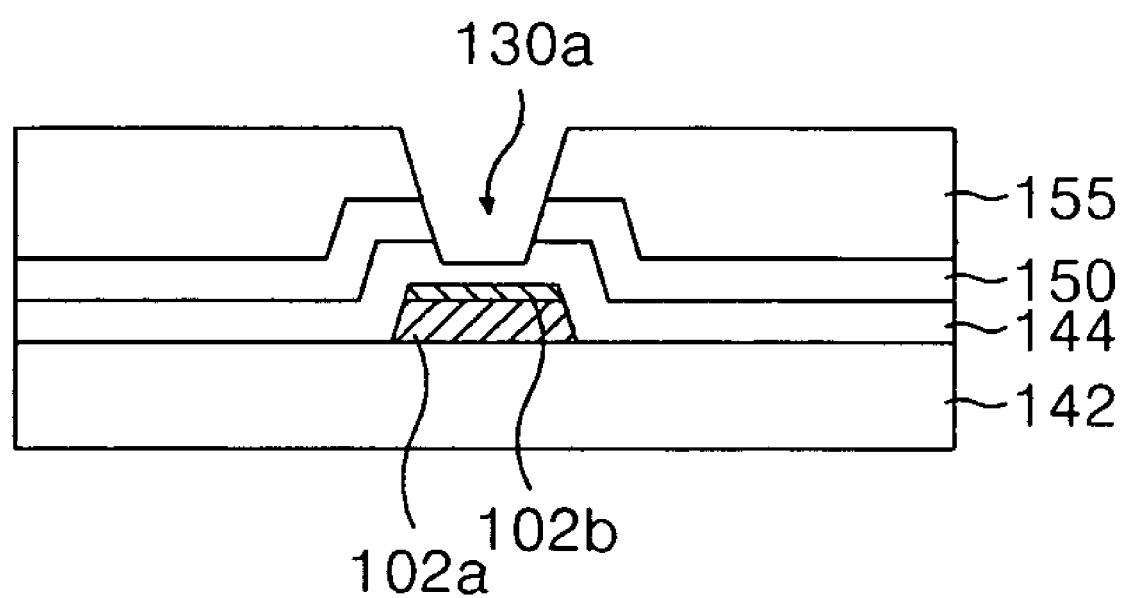

The passivation film 150 is entirely formed on the gate insulating film 144 having the source/drain patterns by a deposition technique such as a plasma enhanced chemical vapor deposition (PECVD). As shown in FIG. 9A, a photo-resist pattern 155 is formed by a photolithography process and an etching process on the lower substrate 142 on which the passivation film 150 is entirely deposited. Subsequently, the gate insulating film 144 and the passivation film 150 are undergo a first dry-etching using the photo-resist pattern 155 at a speed of about 3000 Å/minute to 4000 Å/minute. Accordingly, as shown in FIG. 9B, the first hole 130a, passing through the partial passivation film 150 and the partial gate insulating film 144, is formed while leaving a remaining portion of the gate insulating film 144 having a thickness of about 500 Å to 700 Å.

Figure 9C:
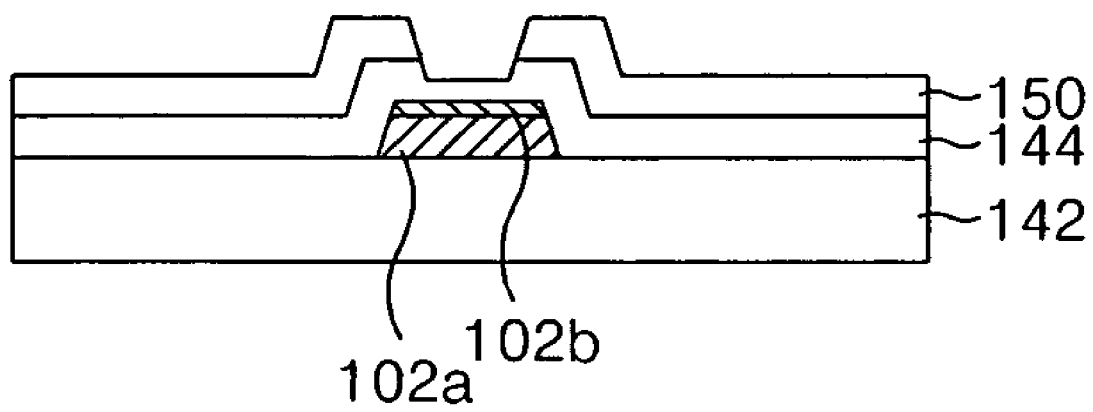

Subsequently, as shown in FIG. 9C, the photo-resist pattern 155 is removed by a stripping process using a developer or a stripper. Since the gate insulating film 144 remains on the lower gate electrode for the stripping process, it is possible to prevent the aluminum system metal layer 102a from being damaged by the stripper or the developer.

Figure 9D:
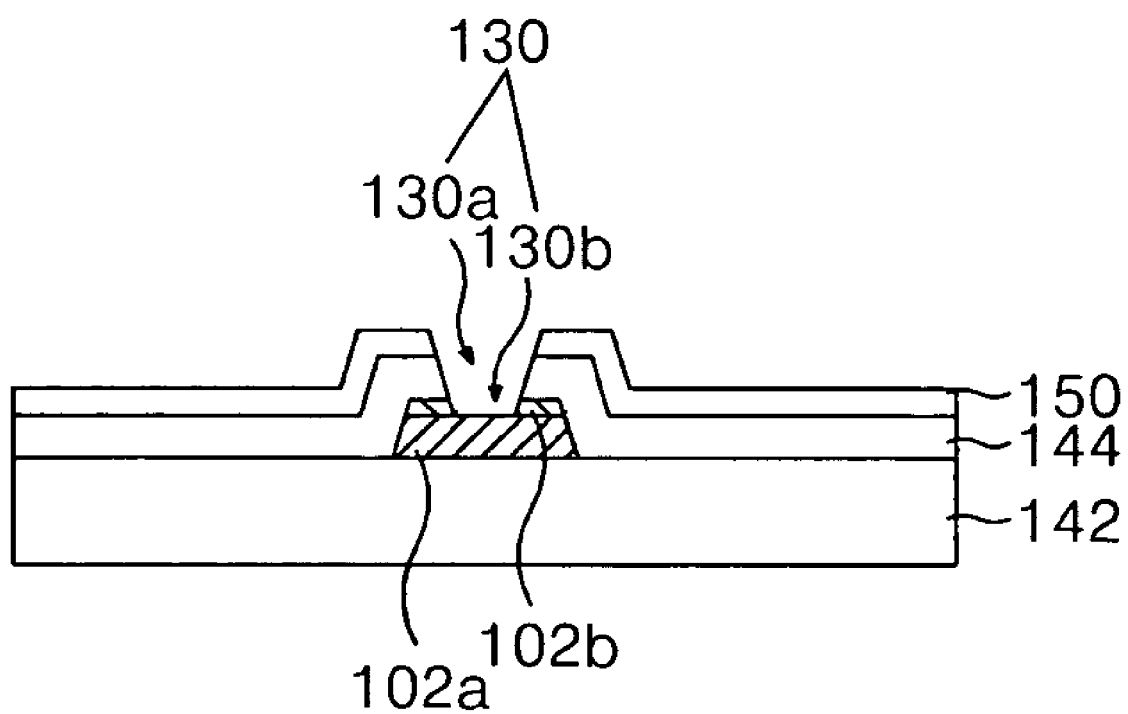

Next, by performing a second dry-etching process with respect to the lower substrate 142, the gate insulating film 144 remaining on the passivation film 150 and the lower gate pad 128 entirely formed on the lower substrate 142, is patterned. Accordingly, as shown in FIG. 9D, a thickness of the passivation film 150 is lowered by a range of 500 Å to 700 Å, and the gate insulating film 144 remaining on the lower gate pad electrode 128 is removed. As a result, the second hole 130b, overlapping the first hole 130a and exposing the lower gate pad electrode 128, is formed. Herein, the second hole 130b has a depth in a range of 500 Å to 700 Å. Meanwhile, the second dry-etching process may pattern up to the molybdenum layer 102b on the aluminum metal layer 102a to thereby expose the aluminum metal layer 102a.

Figure 8D:
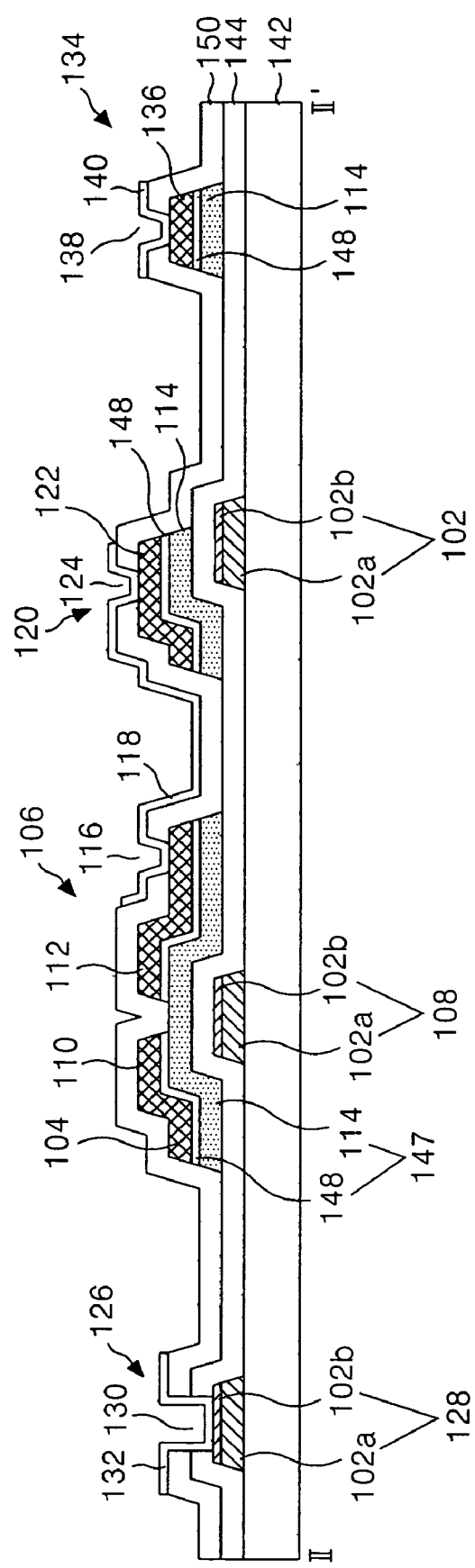

In FIG. 8D, transparent electrode patterns are formed on the passivation film 150.

A transparent electrode material is entirely deposited on the passivation film 150 by a deposition technique such as sputtering and the like. Then, the transparent electrode material is patterned by photolithography using a fourth mask and an etching process, to provide the transparent electrode patterns including the pixel electrode 118, the upper gate pad electrode 132 and the upper data pad electrode 140. The pixel electrode 118 is electrically connected, via the first contact hole 116, to the drain electrode 112 and is electrically connected, via the second contact hole 124, to the storage electrode 122 overlapping a pre-stage gate line 102. The upper gate pad electrode 132 is electrically connected, via the third contact hole 130, to the lower gate pad electrode 128. The upper data pad electrode 140 is electrically connected, via the fourth contact hole 138, to the lower data pad electrode 136. The transparent electrode material may be made of an indium-tin-oxide (ITO), a tin-oxide (TO) or an indium-zinc-oxide (IZO).

As a described above in FIG. 9B, according to the present method of manufacturing the thin film transistor array substrate, the first hole 130a, passing through the partial passivation film 150 and the partial gate insulating film 144 by the first etching process during the gate pad open process, is formed, and the gate insulating film 144 remains on the lower gate pad electrode 128 to have a designated thickness. Subsequently, the strip process is performed on the lower gate pad electrode 128 having the gate insulating film 144 remaining thereon, and thereafter, the second hole 130b is formed through the second etching process to expose the lower gate pad electrode 128. According to the method as set forth above, the lower gate pad electrode 128 is not affected by the developer or the stripper used in the stripping process and thus, damage to the gate pad is prevented.

Meanwhile, the method of exposing the lower gate pad electrode by two times of etching processes may be applicable to a method of a thin film transistor array substrate including steps of forming a gate pattern having a gate line and a lower gate pad electrode by a first mask process, forming a semiconductor pattern of the thin film transistor on a substrate provided with the gate pattern by a second mask process, forming a source/drain pattern having a source electrode connected to the data line and a drain electrode facing to the source electrode on the semiconductor pattern by a third mask process, forming a passivation film having a hole to expose the lower gate pad electrode and the drain electrode of the thin film transistor by a fourth mask, and forming a pixel electrode connected to the drain electrode by a fifth mask.

Figure 10:
FIG. 10 is a photograph showing the pad open process according to the present invention.

As a described above, according to the method of manufacturing the thin film transistor array substrate of the present invention, during the gate pad opening process, the lower gate pad electrode is exposed by the second etching process after performing the stripping process in a state that the gate insulating film having a designated thickness remains on the lower gate pad electrode by the first etching process. Accordingly, the developer or the stripper used in the stripping process does not have an effect on the lower gate pad electrode. Thus, damage to the gate pad is prevented as shown in FIG. 10.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method of manufacturing a thin film transistor array substrate comprising:
    forming gate lines and data lines that cross each other on a lower substrate, a gate insulating film located between the gate lines and data lines, a thin film transistor formed at crossing of the gate lines and data lines, a lower gate pad electrode connected to the gate lines, and a lower data pad electrode;
    forming a passivation film on the substrate provided with the gate insulating film;
    forming a photo-resist pattern on the substrate provided with the passivation film;
    forming a first hole passing through a portion of the passivation film and through a portion of the gate insulating film using the photo-resist pattern, wherein a remaining part of the gate insulating film is left on the lower gate pad electrode;
    then removing the photo-resist pattern;
    then forming a second hole exposing the lower gate pad electrode by a dry etching; and
    forming a transparent electrode pattern through the second hole including an upper gate pad electrode connected to the exposed lower gate pad electrode,
    wherein forming the second hole is done through the remaining part of the gate insulating film.

2. The method according to claim 1, wherein the passivation film and the gate insulating film are etched at a speed of about 3000 Å/minute to 4000 Å/minute.

3. The method according to claim 1, wherein a depth of the second hole is about 500 Å to 700 Å.

4. The method according to claim 1, wherein forming the gate lines, the data lines, the thin film transistor, the lower gate pad electrode, and the lower data pad electrode includes:
    forming a gate pattern having a gate electrode and the lower gate pad electrode on the substrate using a first mask process, the gate electrode being connected to one of the gate lines;
    forming a source/drain pattern having a source electrode and a drain electrode on the substrate provided with the gate pattern using a second mask process, the source electrode being connected to one of the data lines and the drain electrode facing the source electrode;
    forming a semiconductor pattern along a lower portion of the source/drain pattern;
    exposing the lower gate pad electrode and the drain electrode of the thin film transistor using a third mask; and
    forming a pixel electrode using a fourth mask, the pixel electrode being connected to the drain electrode.

5. The method according to claim 1, wherein forming the gate lines, the data lines, the thin film transistor, the lower gate pad electrode, and the lower data pad electrode includes:
    forming a gate pattern having a gate electrode and the lower gate pad electrode using a first mask process, the gate electrode being connected to one of the gate lines;
    forming a semiconductor pattern of the thin film transistor on the substrate provided with the gate pattern using a second mask process;
    forming a source/drain pattern having a source electrode and a drain electrode using a third mask process on the semiconductor pattern, the source electrode being connected to one of the data lines and the drain electrode facing the source electrode;

exposing the lower gate pad electrode and the drain electrode of the thin film transistor using a fourth mask; and forming a pixel electrode using a fifth mask, the pixel electrode being connected to the drain electrode.

6. The method according to claim 1, wherein forming the first hole includes:

forming a first contact hole to expose the lower data pad electrode; and forming a second contact hole to expose the drain electrode of the thin film transistor.

7. The method according to claim 1, wherein forming the transparent electrode pattern includes:

forming an upper data pad electrode connected to the lower data pad electrode; and forming a pixel electrode connected to a drain electrode of the thin film transistor.

8. The method according to claim 1, wherein the lower gate pad electrode includes an aluminum system metal layer.

9. The method according to claim 1, wherein the lower gate pad electrode is formed to have a double-layer structure.

10. The method according to claim 1, wherein the lower gate pad electrode has a structure in which an aluminum system metal layer and a molybdenum metal layer are stacked.

11. A method of manufacturing a thin film transistor array substrate comprising:

forming gate lines and data lines that cross each other on a lower substrate, a gate insulating film located between the gate lines and data lines, a thin film transistor formed at crossing of the gate lines and data lines, a lower gate pad electrode connected to the gate lines, and a lower data pad electrode;

forming a passivation film on the substrate provided with the gate insulating film;

forming a photo-resist pattern on the substrate provided with the passivation film;

forming a first hole passing through the passivation film and partway through the gate insulating film using the photo-resist pattern, wherein a remaining part of the gate insulating film is left on the lower gate pad electrode;

then removing the photo-resist pattern;

after removing the photo-resist pattern, forming a second hole through the remaining part of the gate insulating film and exposing the lower gate pad electrode by a dry etching; and forming a transparent electrode pattern including an upper gate pad electrode connected to the exposed lower gate pad electrode, wherein forming the second hole is done through the remaining part of the gate insulating film.

12. The method according to claim 9, wherein forming the second hole exposing the lower gate pad electrode includes exposing a bottom layer of the double-layer structure.

13. The method according to claim 1, wherein the lower gate pad electrode is not affected by a developer or a stripper used in the process of removing the photo-resist pattern.

14. The method according to claim 1, wherein the dry etching is performed with respect to the entire lower substrate including the gate insulating film remaining on the lower gate pad electrode and the passivation film.

15. The method according to claim 1, wherein forming the second hole includes etching the passivation film by the dry etching.

16. The method according to claim 11, wherein the lower gate pad electrode is not affected by a developer or a stripper used in the process of removing the photo-resist pattern.

17. The method according to claim 11, wherein the dry etching is performed with respect to the entire lower substrate including the gate insulating film remaining on the lower gate pad electrode and the passivation film.

18. The method according to claim 11, wherein forming the second hole includes etching the passivation film by the dry etching.

* * * * *